(12) United States Patent
Oida et al.

(10) Patent No.: US 6,693,243 B1
(45) Date of Patent: Feb. 17, 2004

(54) SURFACE MOUNTING COMPONENT AND MOUNTED STRUCTURE OF SURFACE MOUNTING COMPONENT

(75) Inventors: Toshifumi Oida, Omihachiman (JP); Akihiro Ochii, Shiga-ken (JP); Nobuyoshi Okuda, Shiga-ken (JP); Yoshirou Satou, Shiga-ken (JP); Katsuhiko Fujikawa, Shiga-ken (JP)

(73) Assignee: Murata Manufacturing Co, Ltd., Kyoto (JP)

( * ) Notice: Subject to any disclaimer, the term of this patent is extended or adjusted under 35 U.S.C. 154(b) by 179 days.

(21) Appl. No.: 09/711,571

(22) Filed: Nov. 13, 2000

(30) Foreign Application Priority Data

Nov. 25, 1999 (JP) .......................................... 11-333754

(51) Int. Cl.⁷ ................................................ H05K 1/16
(52) U.S. Cl. ...................... 174/260; 174/52.1; 29/832; 29/846; 257/778; 361/760
(58) Field of Search ................ 174/260, 52.1; 29/846, 850, 832; 257/779, 778; 361/760, 812

(56) References Cited

U.S. PATENT DOCUMENTS

| | | | |
|---|---|---|---|
| 4,417,296 A | | 11/1983 | Schelhorn |
| 4,760,948 A | | 8/1988 | Spiecker |
| 5,042,147 A | * | 8/1991 | Tashiro ........................ 29/846 |
| 5,929,627 A | * | 7/1999 | MacPherson et al. ..... 324/158.1 |
| 6,291,884 B1 | * | 9/2001 | Glenn et al. ................. 257/778 |

FOREIGN PATENT DOCUMENTS

| | | | |
|---|---|---|---|
| EP | 0139431 | | 5/1985 |
| JP | 59-104539 | | 7/1984 |
| JP | 60-17174 | | 9/1985 |
| JP | 5-335438 | | 12/1993 |
| JP | 406303000 | * | 10/1994 .................. 29/850 |
| JP | 7-297312 | | 11/1995 |
| JP | 410112608 | * | 4/1996 |

OTHER PUBLICATIONS

Patent Abstracts of Japan, vol. 1998, No. 04, Mar. 31, 1998 & JP 09–321177 A (Matsushita Electron Corp), Dec. 12, 1997, *abstract*.

Patent Abstracts of Japan, vol. 008, No. 149 (E–255), Jul. 12, 1984 & JP 59–054247 a (Nippon Denki KK), Mar. 29, 1984, *abstract; figure 3*.

European Search Report issued Mar. 5, 2001 in a related application.

* cited by examiner

*Primary Examiner*—Albert W. Paladini
(74) *Attorney, Agent, or Firm*—Keating & Bennett, LLP

(57) ABSTRACT

On a mounting surface of a multilayered component as a surface mounting component, an isolated electrode is arranged so as to be isolated from other terminal electrodes on the mounting surface. For solder applied to the isolated electrode, the application range can be securely limited to an area within the isolated electrode.

12 Claims, 4 Drawing Sheets

SURFACE MOUNTING COMPONENT AND MOUNTED STRUCTURE OF SURFACE MOUNTING COMPONENT

BACKGROUND OF THE INVENTION

1. Field of the Invention

The present invention relates to a surface mounting component, and more particularly to a surface mounting component for which a means for enhancing the bonding strength of the surface mounting component to a mounting board is provided.

2. Description of the Related Art

Surface mounting components, such as a multilayered component having a multilayer structure, are soldered to mounting boards using a known surface-mounting process. Two known surface mounting components are shown in FIGS. 6 and 7. In both of these figures, only the mounting surface of the components is shown.

In FIG. 6, a multilayered surface mounting component 1 has a mounting surface 3 on which a plurality of electrodes is formed. A ground terminal electrode 7 extends across the entire width of the mounting surface 3 (it extends to the left and right side surfaces of the mounting surface 3 as viewed in FIG. 6). Ground terminal electrode 7 also includes extensions 15, 17 and 18 which extend to the top and bottom side surface of surface mounting component 1 as viewed in FIG. 6.

In order to mount the surface mounting component 1 to a mounting board (for example, a circuit board), the central portion 5 and edge portions 16 through 19 of the ground-.terminal electrode 7 are soldered to the motherboard.

As can be seen from the drawing, the ground terminal electrode 7 is formed on a relatively wide area of the mounting surface 3. However, only areas 5 and 16–19 are soldered to the circuit boards so as to limit the amount of solder which is consumed. To this end, three solder resist films 25, made from glass glaze or the like, are formed in the stippled areas so that only the central electrode portion 5 and the end electrode portions 15–19 are exposed.

While this achieves the desired result of insuring that only portions of the ground terminal electrode 7 are soldered to the circuit, it makes it necessary to carry out a process of forming the solder resist films 25 which increases the cost of the multilayered component 1. Additionally, the bonding strength of the solder resist films 25 to the ground terminal electrode 7 is relatively low. Therefore, in some.cases, deficiencies such as release of the solder resist films 25 occur.

The prior art surface.mounting component 2 of FIG. 7 is substantially similar in structure to that of the surface mounting component 1 of FIG. 6. The basic arrangement of the ground terminal electrode 8 and the signal terminals 9–11 is the same as ground electrode 7 and signal terminals 9–11 in FIG. 6. However, rather than covering portions of the ground terminal electrode 8 with solder resist films to constrict the flow of solder on the ground terminal electrode, the prior art of FIG. 2 utilizes a plurality of slits 26 formed in ground terminal electrode 8 for this purpose. However, it is very difficult for the slits 26 to completely prevent solder from flowing to adjacent portions of ground terminal electrode 8. Moreover, the printing operation by which the ground terminal electrode 8 is formed must be highly accurate to properly form the slits 26. The shape and size of the slits 26 tend to become deficient, caused by scratchy printing or blotting.

Furthermore, in both of the multilayered component 1 shown in FIG. 6 and the multilayered component 2 shown in FIG. 7, the ground terminal electrodes 7 and 8 are large. Therefore, in some cases, the ratios of the areas of the electrodes 7 and 8 to the inner conductor films formed inside of the multilayered components 1 and 2 are mismatched, which causes distortion of the multilayered components 1 and 2 during the manufacturing process.

The foregoing problem which occurs in multilayered components can also occur in other types of mounting components.

SUMMARY OF THE INVENTION

Accordingly, it is an object of the present invention to provide a surface mounting component which can solve the above-described problems.

To achieve the object, according to the present invention, there is provided a surface mounting component to be surface-mounted onto a mounting board by soldering, which includes an isolated electrode to be soldered to the mounting board and arranged on a mounting surface of the surface mounting component so as to be electrically (and preferably physically) isolated from other terminal electrodes on the mounting surface.

Preferably, the isolated electrode per se takes an asymmetrical shape, or is arranged asymmetrically with respect to the mounting surface to have a directional discriminating function.

Also preferably, the surface mounting component is a multilayered component, the multilayered component is further provided with a terminal electrode formed on a face of the multilayered component adjacent to the mounting surface, and the isolated electrode is electrically connected to the terminal electrode via a viahole conductor and an inner conductor film formed inside of the multilayered component.

The isolated electrode may be a ground terminal electrode. In this case, the isolated electrode can be also used as a ground terminal electrode, which enhances the ground performance of the surface mounting component and provides stable characteristics.

Furthermore, according to the present invention, there is provided a mounted structure of a surface mounting component including the above described surface mounting component. The bonding strength of the surface mounting component to the mounting board is enhanced, since the isolated electrode is soldered to the mounting board.

BRIEF DESCRIPTION OF THE DRAWINGS

Other features and advantages of the present invention will become apparent from the following description of the invention which refers to the accompanying drawings.

DETAILED DESCRIPTION OF EMBODIMENTS OF THE INVENTION

Figure 1A:
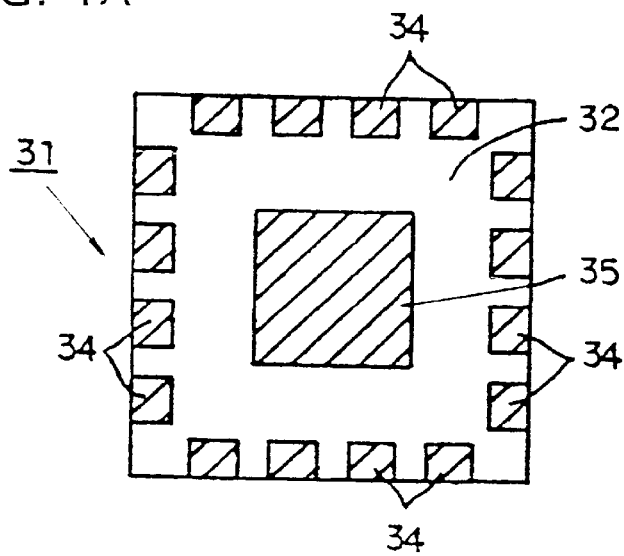
FIG. 1A illustrates the mounting surface of a multilayered component according to a first embodiment of the present invention.
Figure 1B:
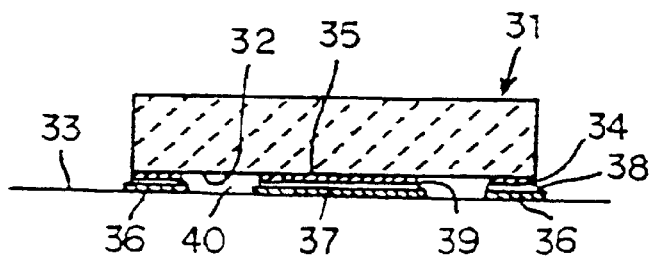
FIG. 1B is a cross section showing the state in which the multilayered component of FIG. 1A is surface-mounted.

FIGS. 1A and 1B show a multilayered surface mounting component 31 according to a first embodiment of the present invention. FIG. 1A shows the mounting surface 32 of the multilayered component 31. FIG. 1B is a cross section of the multilayered component 31 which has been surface-mounted to a motherboard 33 (the inner structure of the multilayered component 31 is not shown).

As shown in FIG. 1A, a plurality of terminal electrodes 34 are arranged on the periphery of the mounting surface 32 of the multilayered component 31. The terminal electrodes 34 may be provided with extensions which extend onto the side faces of the component 31, which side faces are adjacent to (and perpendicular to) the mounting surface 32. An isolated electrode 35 is formed in the center of the mounting surface 32 and arranged within the periphery of the mounting surface 32 so as to be isolated from the respective terminal electrodes 34. It is formed at a location removed from and internally of the periphery of the mounting surface 32. The isolated electrode 35 has a quadrangular shape in the embodiment shown in FIG. 1A. However, any desired shape may be used.

Conductive lands 36, corresponding to the respective terminal electrodes 34, and a conductive land 37, corresponding to the isolated electrode 35, are formed on the motherboard 33, as shown in FIG. 1B. The terminal electrodes 34 are soldered to the conductive lands 36 by means of solder 38 with the mounting surface 32 facing the motherboard 33. Moreover, the isolated electrode 35 is soldered to the conductive land 37 by means of solder 39, thereby increasing the bonding strength of the multilayered component 31 mounted to the motherboard 33. Thus, the multilayered component 31 is securely surface-mounted to the motherboard 33.

The isolated electrode 35 and the respective terminal electrodes 34 are kept sufficiently distant from each other to prevent the solders 38 and 39 from flowing into and filling gaps 40 between the isolated electrode 35 and the terminal electrodes 34.

The isolated electrode 35 may be provided exclusively to enhance the bonding of the multilayered component 31 to the motherboard 33. Alternatively, it may also function as at least a part of the terminal electrodes provided for electrical use as ground terminal electrodes or the like.

Figure 2:
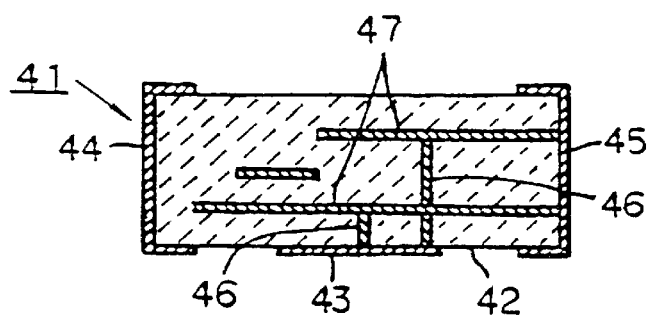
FIG. 2 illustrates the mounting surface of a multilayered component according to a second embodiment of the present invention.

FIG. 2 is a cross section schematically showing a multilayered component 41 according to a second embodiment of the present invention.

In the multilayered component 41, an isolated electrode 43 is formed on a mounting surface 42, and moreover, a respective terminal electrodes 44 and 45 are formed on opposite faces adjacent to the mounting surface 42. The terminal electrodes 44 and 45 each have extensions which extend onto the mounting surface 42 and the face opposite to the mounting surface 42.

Some viaholes 46 and some inner conductor films 47 are formed inside of the multilayered component 41. The isolated electrode 43 is electrically connected to the terminal electrode 45 via the viaholes 46 and the inner conductor films 47.

When the terminal electrode 45 is used as a ground terminal electrode, the isolated electrode 43 can be also used as the ground terminal electrode. Accordingly, the grounding performance of the multilayered component 41 is enhanced, and thereby, stable characteristics can be obtained.

Figure 3:
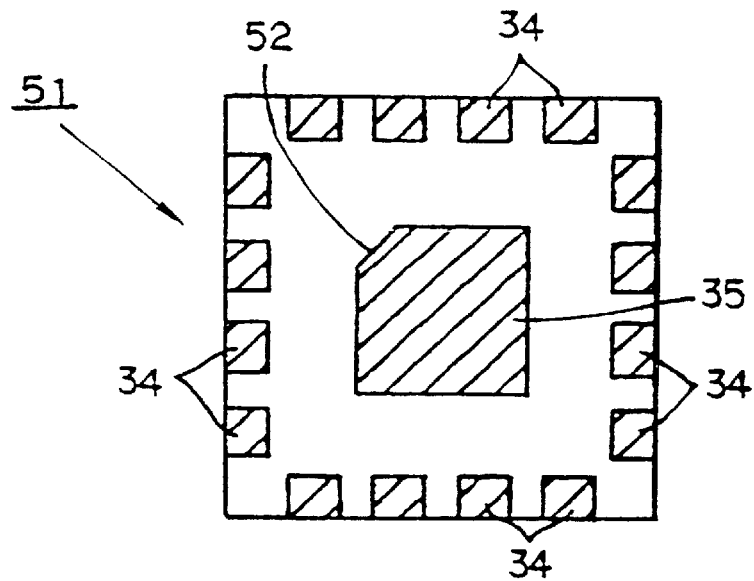
FIG. 3 illustrates the mounting surface of a multilayered component according to a third embodiment of the present invention.
Figure 4:
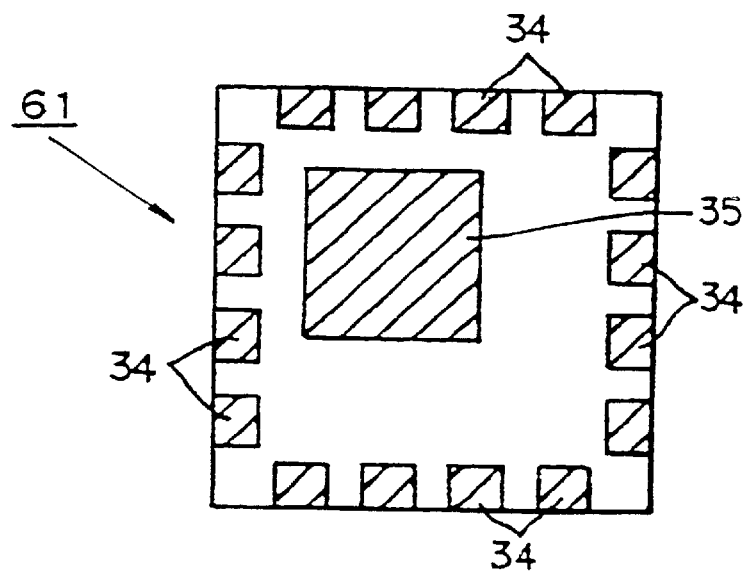
FIG. 4 illustrates the mounting surface of a multilayered component according to a fourth embodiment of the present invention.

FIGS. 3 and 4 illustrate mounting surfaces of multilayered components 51 and 61, respectively, according to third and fourth embodiments of the present invention. The multilayered components 51 and 61 of FIGS. 3 and 4 are provided with many elements which are similar to those of the multilayered component 31 of FIG. 1. In FIGS. 3 and 4, elements corresponding to those shown in FIG. 1 are designated by the same reference numerals, and the description of these elements is omitted.

The shape of an isolated electrode 35 in the multilayered component 51 in FIG. 3 is asymmetrical due to a cut portion 52.

The position of an isolated electrode 35 of the multilayered component 61 shown in FIG. 4 is asymmetrical with respect to the mounting surface 32. The features serve a directional discriminating function which can be used to ensure the proper mounting of the multilayered components 51 and 61.

Figure 5:
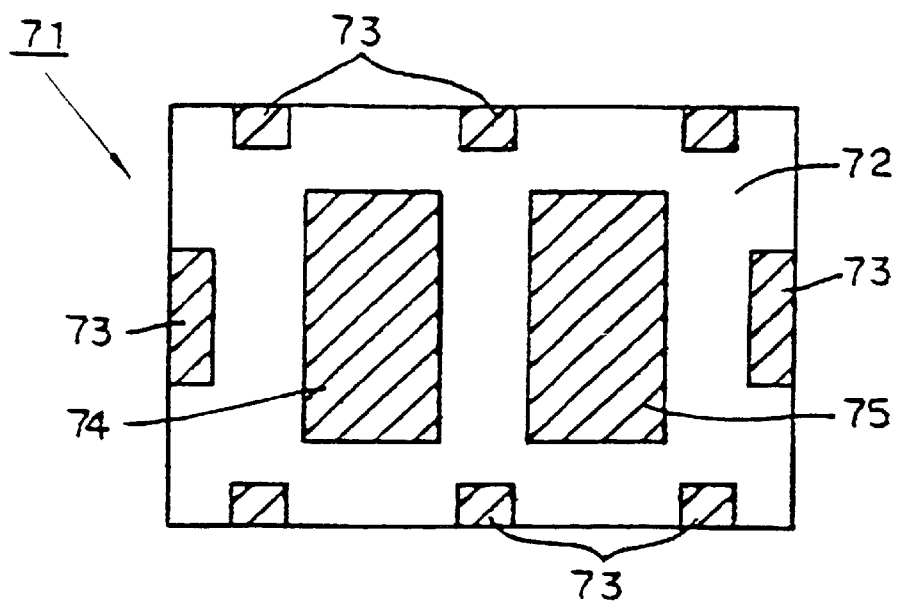
FIG. 5 illustrates the mounting surface of a multilayered component according to a fifth embodiment of the present invention.
Figure 6:
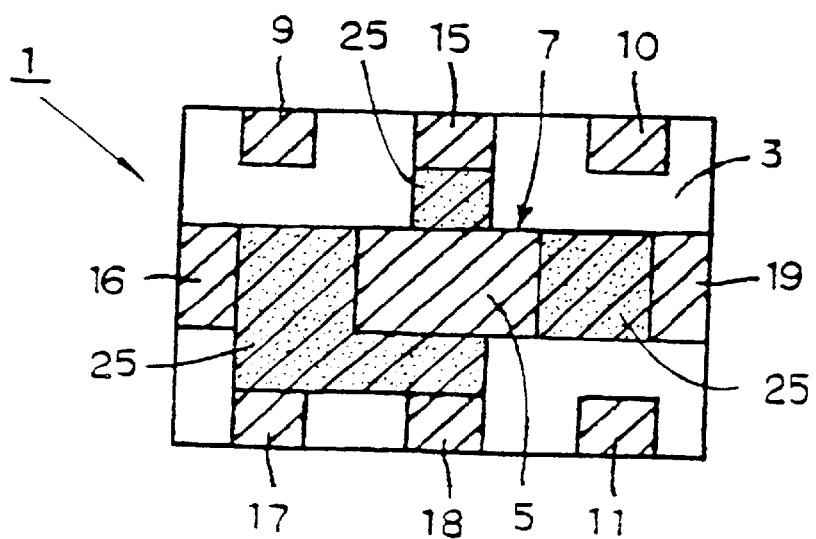
FIG. 6 illustrates the mounting surface of a multilayered component by a first conventional technique.
Figure 7:
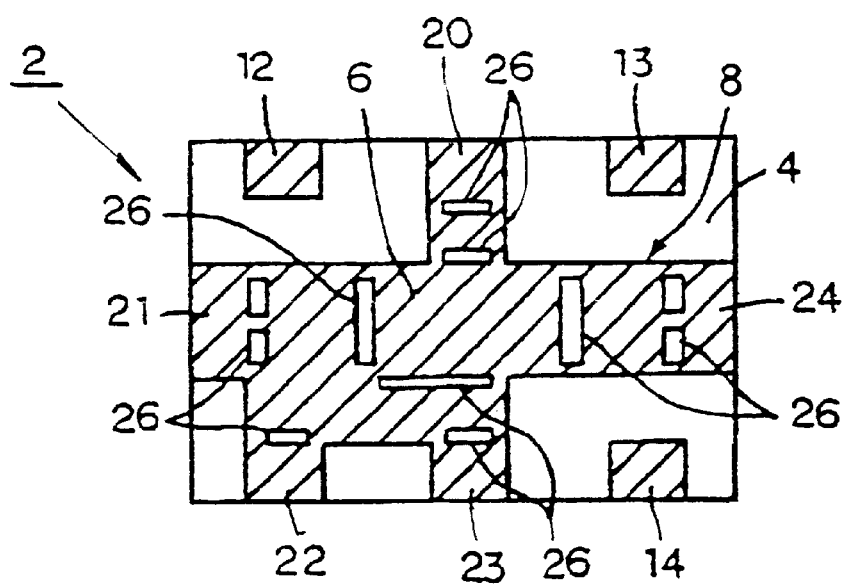
FIG. 7 illustrates the mounting surface of a multilayered component by a second conventional technique.

FIG. 5 illustrates the mounting surface of a multilayered component 71 according to a fifth embodiment of the present invention. In the multilayered component 71, a plurality of terminal electrodes 73 are formed in the periphery of a mounting surface 72, and two isolated electrodes 74 and 75 are arranged in parallel to each other, in the center of the mounting surface 72 so as to be isolated from the respective terminal electrodes 73. As seen in this embodiment, the number of isolated electrodes may be varied.

Heretofore, the present invention has been described in respect to the multilayered components mounted onto the motherboards. The present invention is not limited to multilayered components and can be applied to any surface mounting component, provided that the component is surface-mounted onto an appropriate mounting board by soldering.

As described above, according to the present invention, the isolated electrode is arranged on the mounting surface of the surface mounting component so as to be isolated from other terminals on the mounting surface. By soldering the isolated electrode to a mounting board, the bonding strength of the mounted surface mounting component to the mounting surface can be enhanced, and the application range of the solder applied to the isolated electrode can be securely limited to an area within the isolated electrode.

Accordingly, it is unnecessary to form solder resist films or slits, as in the conventional surface mounting elements. Thus, troubles caused by the formation of the solder resist films or the slits can be eliminated.

By providing an asymmetrical shape for the isolated electrode or positioning the isolated electrode asymmetrically with respect to the mounting surface, a directional discriminating function can be rendered to the isolated electrode. Accordingly, the directional errors during the mounting step of the surface mounting component can be reduced.

Preferably, the surface mounting component of the present invention is a multilayered component, the multilayered component is further provided with a terminal electrode formed on a face of the multilayered component adjacent to the mounting-face, and the isolated electrode is electrically conducted to the terminal electrode via a viahole conductor and an inner conductor film. Accordingly, the isolated electrode can be electrically utilized in addition to its use for enhancement of the bonding strength as described above. When the above-described terminal electrode is a ground terminal electrode, the grounding performance of the multilayered component is enhanced. Thus, stable characteristics can be rendered.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A surface mounting component to be surface-mounted onto a mounting board by soldering, the component comprising:

a mounting surface having a plurality of terminal electrodes formed thereon; and an isolated electrode adapted to be soldered to the mounting board, the isolated electrode arranged on the mounting surface so as to be electrically isolated from the terminal electrodes; wherein the isolated electrode has an asymmetrical shape to have a directional discriminating function.

2. A surface mounting component to be surface-mounted onto a mounting board by soldering, the component comprising:

a mounting surface having a plurality of terminal electrodes formed thereon; and an isolated electrode adapted to be soldered to the mounting board, the isolated electrode arranged on the mounting surface so as to be electrically isolated from the terminal electrodes; wherein the isolated electrode is provided at a location which is asymmetrically with respect to the mounting surface to have a direction discriminating function.

3. A surface mounting component to be surface-mounted onto a mounting board by soldering, the component comprising:

a mounting surface having a plurality of terminal electrodes formed thereon; and an isolated electrode adapted to be soldered to the mounting board, the isolated electrode arranged on the mounting surface so as to be electrically isolated from the terminal electrodes; wherein the surface mounting component is a multilayered component, the multilayered component is further provided with a terminal electrode formed on a face of the multilayered component adjacent to the mounting surface, and the isolated electrode is electrically connected to the terminal electrode via a via hole conductor and an inner conductor film formed inside of the multilayered component.

4. A surface mounting component to be surface-mounted onto a mounting board by soldering, the component comprising:

a mounting surface having a plurality of terminal electrodes formed thereon; and an isolated electrode adapted to be soldered to the mounting board, the isolated electrode arranged on the mounting surface so as to be electrically isolated from the terminal electrodes; wherein the isolated electrode is a ground terminal electrode.

5. A surface mounting component to be surface-mounted onto a mounting board by soldering, the component comprising:

a mounting surface having a plurality of terminal electrodes formed thereon; and an isolated electrode adapted to be soldered to the mounting board, the isolated electrode arranged on the mounting surface so as to be electrically isolated from the terminal electrodes; wherein the terminal electrodes are arranged on a periphery of the mounting surface, and the isolated electrode is provided at a location removed from and internally of the periphery of the mounting surface.

6. A surface mounting component to be surface-mounted onto a mounting board by soldering, the component comprising:

a mounting surface having a plurality of terminal electrodes formed thereon; and an isolated electrode adapted to be soldered to the mounting board, the isolated electrode arranged on the mounting surface so as to be electrically isolated from the terminal electrodes; wherein the isolated electrode is sufficiently distant from the terminal electrodes to prevent solder applied to the isolated electrode from flowing into and filling the spaces between the isolated electrode and the terminal electrodes.

7. A combination comprising:

A) a mounting board;

B) a surface mounting component which is surface mounted onto the mounting board by soldering, the component comprising:

1) a mounting surface having a plurality of terminal electrodes formed thereon; and 2) an isolated electrode which is soldered to the mounting board, the isolated electrode arranged on the mounting surface so as to be electrically isolated from the terminal electrodes; wherein the isolated electrode has an asymmetrical shape to have a directional discriminating function.

8. A combination comprising:

A) a mounting board;

B) a surface mounting component which is surface mounted onto the mounting board by soldering, the component comprising:

1) a mounting surface having a plurality of terminal electrodes formed thereon; and 2) an isolated electrode which is soldered to the mounting board, the isolated electrode arranged on the mounting surface so as to be electrically isolated from the terminal electrodes; wherein the isolated electrode is provided at a location which is asymmetrically with respect to the mounting surface to have a direction discriminating function.

9. A combination comprising:

A) a mounting board;

B) a surface mounting component which is surface mounted onto the mounting board by soldering, the component comprising:

1) a mounting surface having a plurality of terminal electrodes formed thereon; and 2) an isolated electrode which is soldered to the mount-ing board, the isolated electrode arranged on the mounting surface so as to be electrically isolated from the terminal electrodes; wherein the surface mounting component is a multilayered component, the multilayered component is further provided with a terminal electrode formed on a face of the multilayered component adjacent to the mounting surface, and the isolated electrode is electrically connected to the terminal electrode via a via hole conductor and an inner conductor film formed inside of the multilayered component.

10. A combination comprising:

A) a mounting board;

B) a surface mounting component which is surface mounted onto the mounting board by soldering, the component comprising:
  1) a mounting surface having a plurality of terminal electrodes formed thereon; and
  2) an isolated electrode which is soldered to the mounting board, the isolated electrode arranged on the mounting surface so as to be electrically isolated from the terminal electrodes; wherein
    the isolated electrode is a ground terminal electrode.

11. A combination comprising:

A) a mounting board;

B) a surface mounting component which is surface mounted onto the mounting board by soldering, the component comprising:
  1) a mounting surface having a plurality of terminal electrodes formed thereon; and
  2) an isolated electrode which is soldered to the mounting board, the isolated electrode arranged on the mounting surface so as to be electrically isolated from the terminal electrodes; wherein
    the terminal electrodes are arranged on a periphery of the mounting surface, and the isolated electrode is provided at a location removed from and internally of the periphery of the mounting surface.

12. A combination comprising:

A) a mounting board;

B) a surface mounting component which is surface mounted onto the mounting board by soldering, the component comprising:
  1) a mounting surface having a plurality of terminal electrodes formed thereon; and
  2) an isolated electrode which is soldered to the mounting board, the isolated electrode arranged on the mounting surface so as to be electrically isolated from the terminal electrodes; wherein
    the isolated electrode is sufficiently distant from the terminal electrodes to prevent solder applied to the isolated electrode from flowing into and filling the spaces between the isolated electrode and the terminal electrodes.

\* \* \* \* \*